US012107101B2

(12) United States Patent
Xi et al.

(10) Patent No.: US 12,107,101 B2
(45) Date of Patent: Oct. 1, 2024

(54) PACKAGE STRUCTURE, PACKAGING METHOD, CAMERA MODULE, AND ELECTRONIC EQUIPMENT

(71) Applicants: Shanghai AVIC OPTO Electronics Co., Ltd., Shanghai (CN); Shanghai Tianma Micro-Electronics Co., Ltd., Shanghai (CN)

(72) Inventors: Kerui Xi, Shanghai (CN); Xuhui Peng, Shanghai (CN); Feng Qin, Shanghai (CN); Tingting Cui, Shanghai (CN); Zhenyu Jia, Shanghai (CN)

(73) Assignees: Shanghai AVIC OPTO Electronics Co., Ltd., Shanghai (CN); Shanghai Tianma Micro-Electronics Co., Ltd., Shanghai (CN)

( * ) Notice: Subject to any disclaimer, the term of this patent is extended or adjusted under 35 U.S.C. 154(b) by 383 days.

(21) Appl. No.: 17/546,740

(22) Filed: Dec. 9, 2021

(65) Prior Publication Data

US 2022/0102406 A1 Mar. 31, 2022

(30) Foreign Application Priority Data

Jun. 30, 2021 (CN) .......................... 202110732770.5

(51) Int. Cl.
*H01L 27/146* (2006.01)
*H01L 25/16* (2023.01)

(52) U.S. Cl.
CPC ...... *H01L 27/14618* (2013.01); *H01L 25/167* (2013.01); *H01L 27/1462* (2013.01); *H01L 27/14627* (2013.01); *H01L 27/14636* (2013.01)

(58) Field of Classification Search
CPC ......... H01L 27/14618; H01L 27/14689; H01L 25/167; H01L 27/1462; H01L 27/14627;
(Continued)

(56) References Cited

U.S. PATENT DOCUMENTS

2008/0239522 A1* 10/2008 Kinoshita ......... H01L 27/14618
359/822
2014/0168510 A1* 6/2014 Hamada ................ H04N 23/54
348/374
(Continued)

FOREIGN PATENT DOCUMENTS

CN 102623477 A 8/2012
CN 103943645 A 7/2014
(Continued)

OTHER PUBLICATIONS

State Intellectual Property Office of the People's Republic of China, First Office Action, Chinese Application No. 202110732770.5, Mailed Apr. 7, 2022, 25 pages.

*Primary Examiner* — Jonathan Han
(74) *Attorney, Agent, or Firm* — CHRISTENSEN O'CONNOR JOHNSON KINDNESS PLLC

(57) ABSTRACT

The present disclosure provides chip package structure, packaging method, camera module and electronic equipment. The package structure includes chip package module, which includes light-transmitting substrate, wiring layer located on side of light-transmitting substrate and including first metal wire, conductor located on side of wiring layer facing away from light-transmitting substrate, photosensitive chip located on side of wiring layer facing away from the light-transmitting substrate, active chip located on side of wiring layer facing away from light-transmitting substrate, and plastic encapsulation layer encapsulating photosensitive chip and active chip. The conductor includes first end electrically connected to first metal wire, and second end. The photosensitive chip includes pin electrically connected to first metal wire and has photosensitive surface facing towards light-transmitting substrate. The photosensitive surface includes photosensitive region that is not over-
(Continued)

lapping first metal wire. The active chip includes pin electrically connected to first metal wire.

20 Claims, 12 Drawing Sheets

(58) Field of Classification Search
CPC .......... H01L 27/14636; H01L 23/3121; H01L 21/563; H01L 23/14; H01L 27/146; H04N 23/54; H04N 25/76
See application file for complete search history.

(56) References Cited

U.S. PATENT DOCUMENTS

| | | | |
|---|---|---|---|
| 2018/0205866 A1* | 7/2018 | Komai | H01L 27/1463 |
| 2020/0176496 A1* | 6/2020 | Kimura | H04N 23/54 |
| 2020/0388640 A1* | 12/2020 | Yu | H01L 27/14618 |

FOREIGN PATENT DOCUMENTS

| | | |
|---|---|---|
| CN | 103956371 A | 7/2014 |
| CN | 105244360 A | 1/2016 |
| CN | 107104087 A | 8/2017 |
| CN | 109935604 A | 6/2019 |
| CN | 111276451 A | 6/2020 |

\* cited by examiner

PACKAGE STRUCTURE, PACKAGING METHOD, CAMERA MODULE, AND ELECTRONIC EQUIPMENT

CROSS-REFERENCE TO RELATED APPLICATIONS

The present application claims priority to Chinese Patent Application No. 202110732770.5, filed on Jun. 30, 2021, the content of which is incorporated herein by reference in its entirety.

TECHNICAL FIELD

The present disclosure relates to the field of packaging technology, in particular to a package structure, a packaging method, a camera module, and an electronic equipment.

BACKGROUND

A complementary metal oxide semiconductor (CMOS) image sensor (CIS) chip is an electronic component that can sense external light and convert it to electrical signals, and is widely used in electronic devices such as cameras. The CIS chip is usually manufactured with a semiconductor manufacturing process, and then a package structure is formed by performing a series of packaging processes on the CIS chip. However, the package structure of the CIS chip in the related art is relatively large, which is not conducive to realize a thin and light design of the electronic equipment. In addition, the CIS chip in the related art requires a large number of wiring and routing in a plastic or ceramic substrate, causing a low yield.

SUMMARY

In one aspect, an embodiment of the present disclosure provides a package structure including a chip package module. The chip package module includes a light-transmitting substrate, a wiring layer located on a side of the light-transmitting substrate and including a first metal wire, a conductor located on a side of the wiring layer facing away from the light-transmitting substrate, a photosensitive chip located on the side of the wiring layer facing away from the light-transmitting substrate, an active chip located on the side of the wiring layer facing away from the light-transmitting substrate and including a pin electrically connected to the first metal wire, and an encapsulation layer encapsulates the photosensitive chip and the active chip. The conductor includes a first end electrically connected to the first metal wire, and a second end. The photosensitive chip includes a pin electrically connected to the first metal wire and has a photosensitive surface configured to sense a photometric signal, and the photosensitive surface faces towards the light-transmitting substrate and includes a photosensitive region not overlapping the first metal wire in a direction perpendicular to a plane of the light-transmitting substrate (also referred to as a principal plane of the light-transmitting substrate).

In another aspect, an embodiment of the present disclosure provides a packaging method. The packaging method includes forming a chip package module. The forming of the chip package module includes forming a wiring layer including a first metal wire on a first side of the light-transmitting substrate by using a film forming process, and binding a photosensitive chip and an active chip to a side of the wiring layer facing away from the light-transmitting substrate and forming a conductor and a encapsulation layer. The photosensitive chip includes a photosensitive surface configured to sense a light signal, the photosensitive surface faces towards the light-transmitting substrate and has a photosensitive region, and the first metal wire does not overlap the photosensitive region in a direction perpendicular to a plane of the light-transmitting substrate, the conductor has a first end electrically connected to the first metal wire, and the encapsulation layer encapsulates the photosensitive chip and the active chip.

In still another aspect, an embodiment of the present disclosure provides a camera module. The camera module includes the package structure described above, and a lens assembly including a housing and at least one lens located in the housing. The at least one lens is located on a side of the light-transmitting substrate facing away from the photosensitive chip in the package structure, and overlaps the photosensitive region of the photosensitive chip in the direction perpendicular to the plane of the light-transmitting substrate.

In yet still another aspect, an embodiment of the present disclosure provides an electronic device. The electronic device includes the camera module described above, and a driver chip configured to generate an image based on an electrical signal converted by the photosensitive chip of the camera module.

BRIEF DESCRIPTION OF DRAWINGS

In order to more clearly illustrate technical solutions of embodiments of the present disclosure, the accompanying drawings required to be used in the embodiments are briefly described below. The drawings described below are merely some embodiments of the present disclosure. For those of ordinary skill in the art, other drawings can be obtained from these drawings.

DESCRIPTION OF EMBODIMENTS

In order to better understand technical solutions of the present disclosure, the embodiments of the present disclosure are described in detail with reference to the drawings.

It should be clear that the described embodiments are only some embodiments of the present disclosure, not all embodiments. Based on the embodiment of the present disclosure, all other embodiments obtained by those of ordinary skill in the art shall fall within the protection scope of the present disclosure.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

It should be understood that the term "and/or" used in this specification describes only an association relationship for describing associated objects and represents that three relationships may exist. For example, A and/or B may represent the following three cases: A alone, A and B, and B alone. In addition, the character "/" in this specification generally indicates that the associated objects are in an "or" relationship.

It should be understood that although terms "first" and "second" can be used in the embodiments of the present disclosure to describe circuit boards, these circuit boards should not be limited to these terms. These terms are used only to distinguish the circuit boards from each other. For example, without departing from the scope of the embodiments of the present disclosure, a first circuit board can also be referred to as a second circuit board; and similarly, a second circuit board can also be referred to as a first circuit board.

Before describing the technical solutions provided by the embodiments of the present disclosure, the present disclosure first describes the package structure in the related art.

In the related art, a plastic leaded chip carrier (PLCC) packaging process or a ceramic leaded chip carrier (CLCC) packaging process is often used to package the CIS chip.

Figure 1:
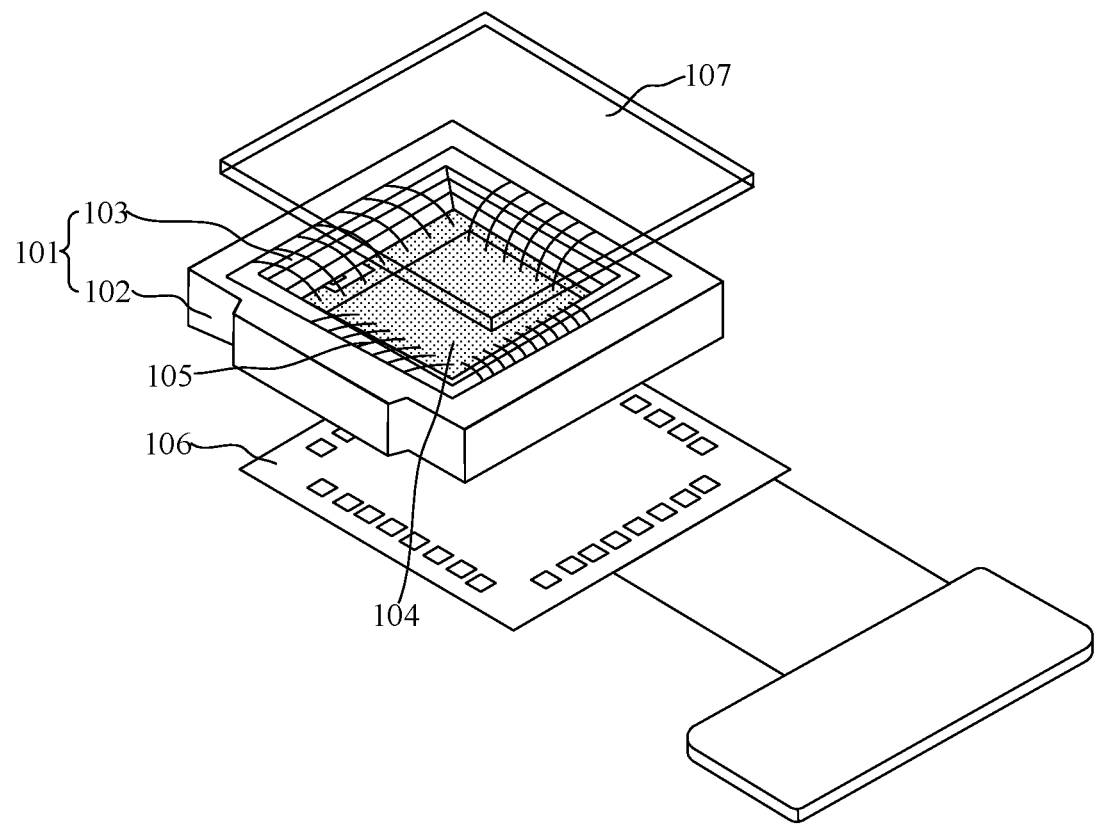
FIG. 1 is a schematic diagram of a package structure in the related art.

FIG. 1 is a schematic diagram of a package structure in the related art. As shown in FIG. 1, the package structure includes a substrate body 101 in a shape of a pit. The substrate body 101 includes a base 102 made of a plastic or ceramic material, and a dam 103. The CIS chip 104 is disposed in the pit of the substrate body 101, and a pin of the CIS chip 104 is bonded to a conductive wire 105 (copper wire or gold wire) provided in the substrate body 101, and is connected to a side where the dam 103 is located through the conductive wire 105, and then the entire structure is provided on the circuit board 106, and the conductive wire 105 at the side of the dam 103 is electrically connected to the circuit board 106 to realize the signal transmission between the CIS chip 104 and the external signal device.

However, a thickness of the base 102 in the above-mentioned package structure is as high as a few millimeters, which makes the overall thickness of the package structure larger. Moreover, a large number of conductive wires 105 need to be provided in the substrate body 101, which not only leads a large frame width of the package structure, but also causes a low manufacturing yield.

Figure 2:
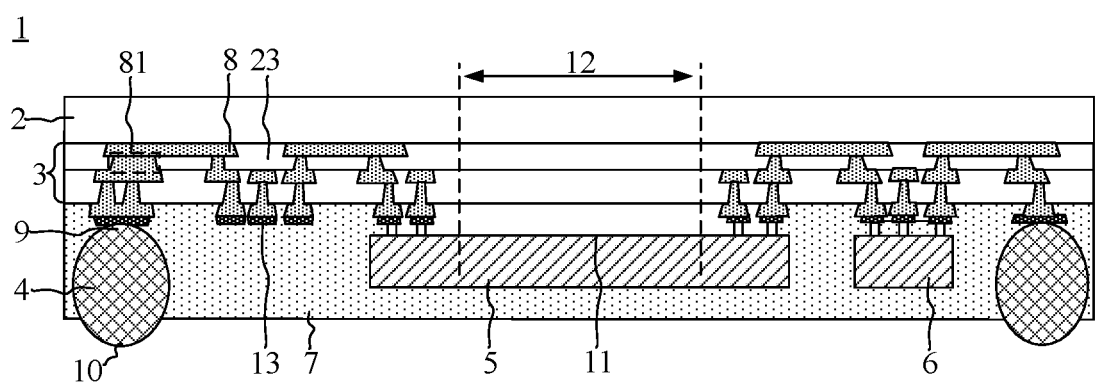
FIG. 2 is a schematic diagram of a package structure provided by an embodiment of the present disclosure.
Figure 3:
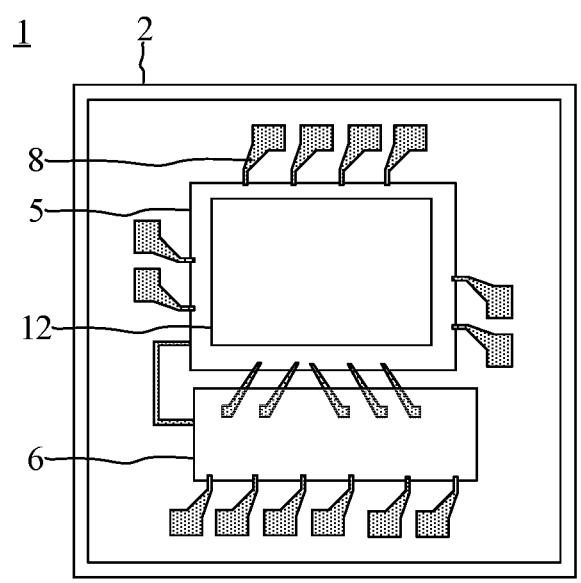
FIG. 3 is a top view corresponding to FIG. 2.

An embodiment of the present disclosure provides a package structure. FIG. 2 is a schematic diagram of the package structure provided by the embodiment of the present disclosure, and FIG. 3 is the top view corresponding to FIG. 2. As shown in FIG. 2 and FIG. 3, the package structure includes a chip package module 1, and the chip package module 1 includes a light-transmitting substrate 2, a wiring layer 3, a conductor 4, a photosensitive chip 5, an active chip 6 and an encapsulation layer 7.

The wiring layer 3 is located on a side of the light-transmitting substrate 2, and the wiring layer 3 includes a first metal wire 8. It should be noted that the wiring layer 3 can include a single layer of first metal wire 8 or multiple layers of first metal wire 8. When the wiring layer 3 includes multiple layers of first metal wire 8, a transparent interlayer dielectric layer 23 is provided between two adjacent layers of the first metal wire 8, and two adjacent layers of the first metal wire 8 are electrically connected through a via 81.

The conductor 4 can be a mounting ball. The conductor 4 is located on the side of the wiring layer 3 facing away from the light-transmitting substrate 2 and includes a first end 9 and a second end 10, and the first end 9 is electrically connected to the first metal wire 8.

The photosensitive chip 5 can be a CIS chip configured to convert the sensed optical signal to an electrical signal. The photosensitive chip 5 is located on the side of the wiring layer 3 facing away from the light-transmitting substrate 2. A pin of the photosensitive chip 5 and the first metal wire 8 are electrically connected to each other. The photosensitive chip 5 includes a photosensitive surface 11 configured to sense light signals. The photosensitive surface 11 faces towards the light-transmitting substrate 2 and includes a photosensitive region 12, and the first metal wire 8 and the photosensitive region 12 do not overlap in a direction perpendicular to a plane of the light-transmitting substrate 2 (also referred to as a principal plane of the light-transmitting substrate).

The active chip 6 can include a digital signal processing (DSP) chip configured to process electrical signals converted by the photosensitive chip 5, and the active chip 6 is located on the side of the wiring layer 3 facing away from the light-transmitting substrate 2. A pin of the active chip 6 is electrically connected to the first metal wire 8.

The encapsulation layer 7 encapsulates the photosensitive chip 5 and the active chip 6 to protect the photosensitive chip 5 and the active chip 6. The encapsulation layer 7 can be made of materials such as epoxy molding compound (EMC).

Figure 4:
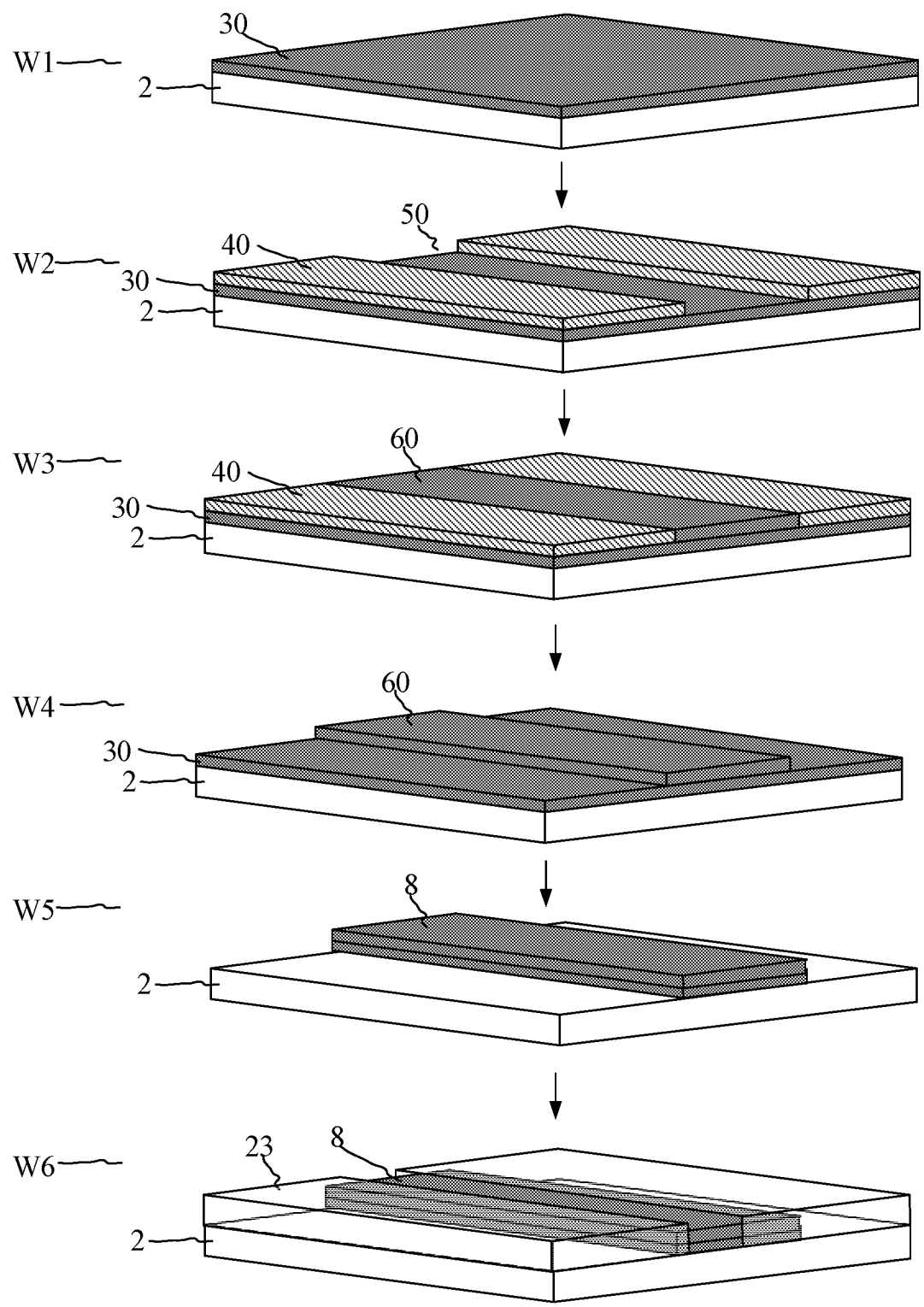
FIG. 4 is a schematic diagram of a film forming process of a wiring layer provided by an embodiment of the present disclosure.

It should be noted that, in the embodiment of the present disclosure, the wiring layer 3 is directly formed on the side of the light-transmitting substrate 2 with a film forming process. For example, the wiring layer 3 can be formed with a film forming process such as patterned electroplating, patterned photolithography, or patterned etching. Taking the wiring layer 3 being formed by the patterned electroplating process as an example, as shown in FIG. 4, FIG. 4 is a schematic diagram of the film forming process of the wiring layer provided by the embodiment of the present disclosure, and a process flow of forming the first metal wire 8 in the wiring layer 3 includes:

- Step W1: sputtering to form a Cu seed layer 30 on the light-transmitting substrate 2 using a physical vapor deposition (PVD) process;
- Step W2: forming a photoresist 40 on the Cu seed layer 30, and patterning the photoresist 40 to form an opening 50;
- Step W3: forming a Cu layer 60 in the opening 50 with an electroplating process;
- Step W4: removing the photoresist 40;
- Step W5: removing excessive Cu with a wet-etching to form the first metal wire 8; and
- Step W6: coating the interlayer dielectric layer 23, and performing etching and development on the interlayer dielectric layer 23 to form a via. The interlayer dielectric layer 23 can be a polyimide (PI) film.

Then, the above steps can be repeated to fabricate the wiring layer 3 with multiple layers of the first metal wire 8 according to remands.

The light-transmitting substrate 2 can be glass, for example, quartz glass. In this case, the light-transmitting substrate 2 not only has a high light transmittance, but has a high-temperature resistance, which is sufficient to withstand a higher process temperature of the film forming process for the wiring layer 3. In addition, the glass substrate can maintain the required flatness, and the shape of the wiring layer 3 can be maintained when the wiring layer 3 is fabricated, thereby improving the position control accuracy of the wiring layer 3.

Contrary to the related art, in the embodiment of the present disclosure, the photosensitive chip 5 is flip-mounted on the light-transmitting substrate 2. When the chip package module 1 is applied in an electronic device, the light-transmitting substrate 2 is located outside the photosensitive chip 5. The ambient light first passes through the light-transmitting substrate 2, and then enters the photosensitive surface 11 of the photosensitive chip 5, so that the photosensitive chip 5 collects the ambient light from the outside and converts the collected light signals into electrical signal. Moreover, by making the first metal wire 8 in the wiring layer 3 not overlap the photosensitive region 12, it is also possible to prevent the ambient light from being shield by t the metal wire 8 when the ambient light passing through the light-transmitting substrate 2 and entering the photosensitive chip 5, which improves the light penetration rate.

An embodiment of the present disclosure adopts a fan-out panel-level packaging (FOPLP) process to package the photosensitive chip 5. The photosensitive chip 5 is electrically connected to the wiring layer 3 on the light-transmitting substrate 2. On the one hand, the light-transmitting substrate 2 and the wiring layer 3 both have a very small thickness. For example, the thickness of the light-transmitting substrate 2 is only in the order of a few tenths of a millimeter or even a few hundredths of a millimeter. The total thickness of the light-transmitting substrate 2 and the wiring layer 3 is much smaller than that in the prior art. Compared with the related art, the package structure provided by the embodiment of the present disclosure is thinner.

On the other hand, in the embodiment of the present disclosure, the pin of the photosensitive chip 5 is directly electrically connected to the first metal wire 8 in the wiring layer 3, and then is electrically connected to the circuit board through the conductor 4. With such configuration, there is no need to provide a large number of conductive wires in the package structure, thereby avoiding the problems of large frame width, poor connection accuracy, low yield, and high power consumption of the package structure that are caused by the large number of conductive wires.

In the related art, the active chip is usually bound to the circuit board, and the photosensitive chip and the active chip are electrically connected to each other through the conductive wire in the main body of the substrate and the metal wire on the circuit board. With such configuration, in order to achieve a reliable electrical connection between the active chip and the circuit board, the pin size and pin spacing of the active chip can match the wire width and spacing of the metal wires in the circuit board, respectively. The wire width and spacing of the metal wires in the circuit board are relatively large, so the size and spacing of the pins in the active chip can also be larger, which leads to a larger volume of the active chip and thus will affect the whole volume of the packaging structure.

In an embodiment of the present disclosure, both the active chip 6 and the photosensitive chip 5 are packaged inside the chip package module 1. Compared with the circuit board, the first metal wires 8 in the wiring layer 3 have a higher accuracy, a small width, and small wire spacings. Therefore, when the active chip 6 is electrically connected to the first metal wire 8, the size and the spacing of the pins of the active chip 6 can also be designed to be smaller, that is, the active chip 6 with a smaller volume is packaged inside the chip package module 1. Such configuration not only has a higher degree of integration, but also reduces the whole volume of the package structure. In addition, both the active chip 6 and the photosensitive chip 5 are packaged inside the chip package module 1. The active chip 6 and the photosensitive chip 5 can be electrically connected to each other through the first metal wire 8 in the wiring layer 3 without the circuit board, and thus the connection between them is more reliable.

It should be noted that, compared to other methods of arranging metal wires on the light-transmitting substrate 2, for example, adhering a carrier plate formed with metal wires to the light-transmitting substrate, the rewiring in the embodiment of the present disclosure Layer 3 is directly formed on the light-transmitting substrate 2 with the film forming process, and the alignment accuracy of the wiring layer 3 and the light-transmitting substrate 2 is higher. Therefore, the first metal wire 8 in the wiring layer 3 and the pin in the photosensitive chip 5 are connected to each other more accurately.

In an embodiment, referring to FIG. 2 again, an anti-oxidation layer 13 is provided on the side of the wiring layer 3 facing away from the light-transmitting substrate 2 and can be made of a conductive material that is not easily oxidized, such as nickel alloy or indium tin oxide. The anti-oxidation layer 13 covers the first metal wire 8 in in the wiring layer 3, and the first wire 8 is at least partially exposed outside (i.e., outside of the wiring layer 3), to prevent this part of the first metal wire 8 from being oxidized, thereby improving a connection reliability between the first metal wire 8 and the conductor 4 and a connection reliability between the photosensitive chip 5 and the active chip 6.

In the related art, in order to filter the infrared light in the ambient light, referring to FIG. 1 again, an infrared filter 107 is separately provided on the side of the photosensitive chip 104 facing away from the substrate 102. However, in the embodiment of the present disclosure, a layer of infrared filter film can be directly disposed on the light-transmitting substrate 2, and the light-transmitting substrate 2 provided with the infrared filter film can be reused as a filter structure.

Figure 5:
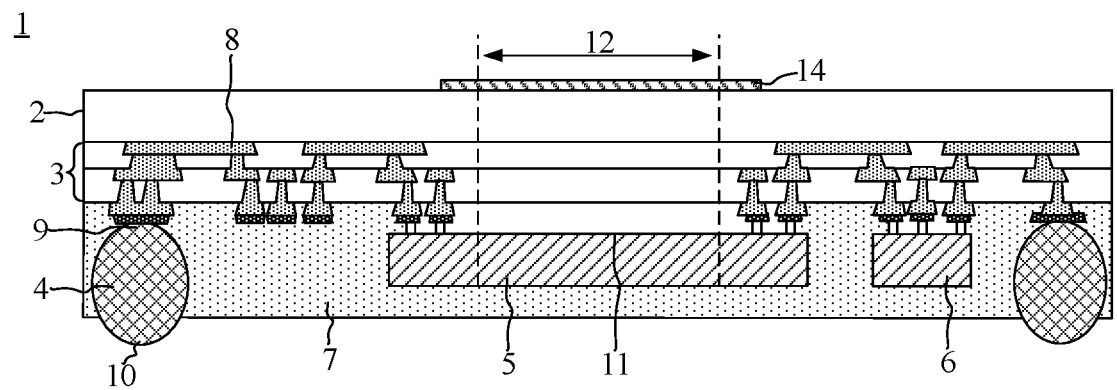
FIG. 5 is a schematic diagram of a package structure provided by an embodiment of the present disclosure.

FIG. 5 is a schematic diagram of another structure of the package structure provided by an embodiment of the present disclosure. As shown in FIG. 5, the chip package module 1 further includes an infrared filter film 14 located on a side of the light-transmitting substrate 2, and the infrared filter film 14 overlaps the photosensitive region 12 in the direction perpendicular to the plane of the light-transmitting substrate 2. The infrared filter film 14 can be formed on a side of the light-transmitting substrate 2 with the film forming process, or can be attached to the side of the light-transmitting substrate 2.

Based on the relative positional relationship between the light-transmitting substrate 2 and the photosensitive chip 5, when the package structure is employed in an electronic device, the light-transmitting substrate 2 is located outside the photosensitive chip 5, and ambient light first passes through the light-transmitting substrate 2, and is filtered by the infrared filter film 14 on the side of the light-transmitting substrate 2 to filter the infrared light, and then enters the photosensitive chip 5. With such configuration, the light-transmitting substrate 2 with the infrared filter film 14 serves not only as the carrier substrate for the wiring layer 3, but also is reused as an infrared filter structure. Therefore, there is no need to provide an additional filter structure in the package structure, which reduces the whole thickness of the package structure and saves the manufacturing cost.

Figure 6:
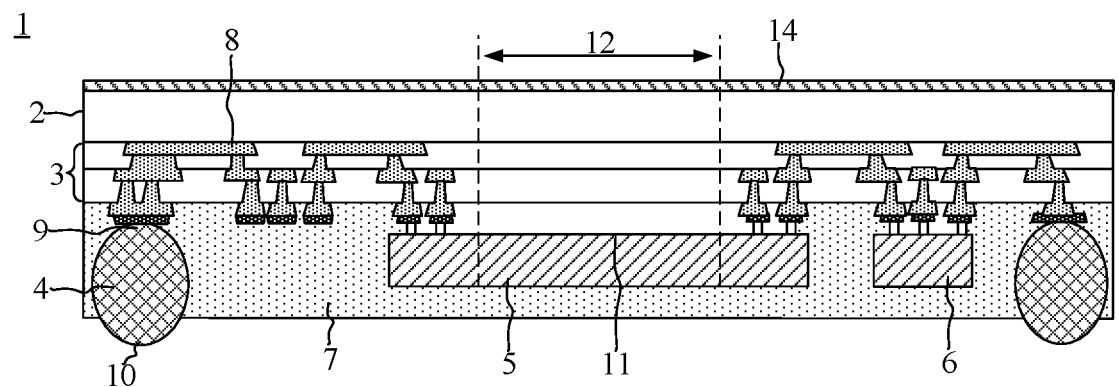
FIG. 6 is a schematic diagram of an infrared filter film provided by an embodiment of the present disclosure.

It should be noted that, referring to FIG. 5 again, the infrared filter film 14 can only cover a part of the light-transmitting substrate 2 to save packaging costs. FIG. 6 is a schematic diagram of an infrared filter film provided by another embodiment of the present disclosure. In another embodiment, as shown in FIG. 6, the infrared filter film 14 can also cover the entire light-transmitting substrate 2 in the direction perpendicular to the plane of the light-transmitting substrate 2. For example, the infrared filter film 14 is attached to the side of the light-transmitting substrate 2 over the entire surface, so as to avoid a case where the infrared filter film 14 cannot completely cover the photosensitive region 12, caused by misalignment and other factors.

In an embodiment, referring to FIG. 5 and FIG. 6 again, the infrared filter film 14 is located on the side of the light-transmitting substrate 2 facing away from the photosensitive chip 5. In this case, the infrared filter film 14 and the wiring layer 3 are respectively located on two opposite sides of the light-transmitting substrate 2, the infrared filter film 14 will not affect the film forming process of the wiring layer 3, which reduces the risk that the wiring layer 3 is detached from the light-transmitting substrate 2.

Figure 7:
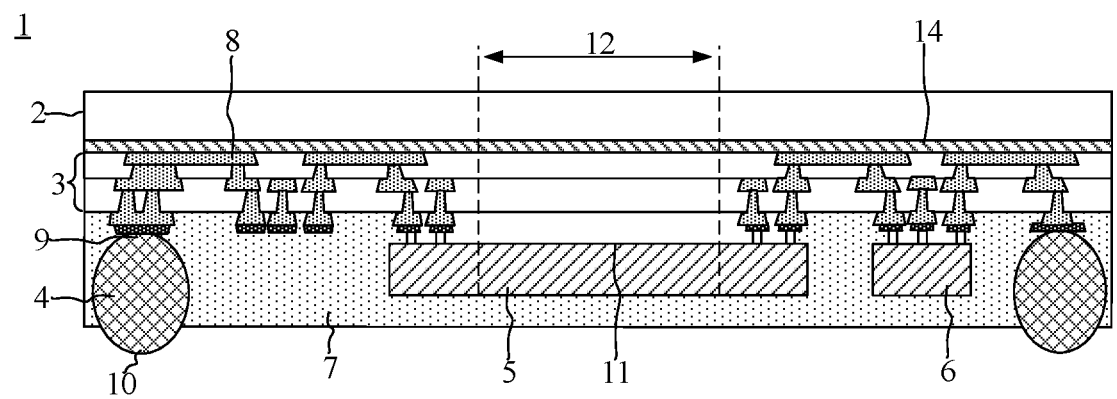
FIG. 7 is a schematic diagram of an infrared filter film provided by another embodiment of the present disclosure.

In another embodiment, as shown in FIG. 7, FIG. 7 is a schematic diagram of an infrared filter film provided by an embodiment of the present disclosure. The infrared filter film 14 is located on a side of the light-transmitting substrate 2 facing towards the photosensitive chip 5 and is located between the light-transmitting substrate 2 and the wiring layer 3. In this case, the infrared filter film 14 and the wiring layer 3 are fabricated on a same side of the light-transmitting substrate 2, and there is no need to invert the light-transmitting substrate 2 after forming the infrared filter film 14 to further form the wiring layer 3, or after the wiring layer 3 is formed to form the infrared filter film 14, which makes the process simpler and reduces the risk of film detachment caused by the light-transmitting substrate 2 being flip-mounted. With such configuration, the infrared filter film 14 is located in the cell of the package structure. When the package structure is impacted or squeezed by an external force, the infrared filter film 14 can be effectively protected from detachment.

Figure 8:
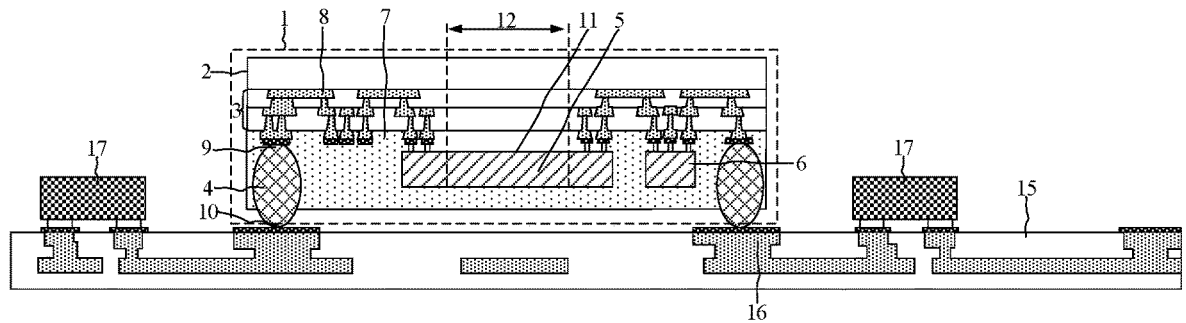
FIG. 8 is a schematic diagram of a package structure provided by another embodiment of the present disclosure.

In an embodiment, as shown in FIG. 8, FIG. 8 is a schematic diagram of a package structure provided by an embodiment of the present disclosure, and the package structure further includes a first circuit board 15 bound to the chip package module 1 and located on a side of the encapsulation layer 7 facing away from the light-transmitting substrate 2. The first circuit board 15 includes a second metal wire 16, and a second end 10 of the conductor 4 is electrically connected to the second metal wire 16. It should be noted that, in order to achieve a reliable electrical connection between the conductor 4 and the second metal wire 16, the second end 10 of the conductor 4 is exposed out of the encapsulation layer 7.

With such configuration, signals output by the photosensitive chip 5 and the active chip 6 are transmitted to the conductor 4 through the first metal wire 8, and then transmitted to the first circuit board 15 through the conductor 4, thereby realizing signal transmission with an external signal device, such as a central processing unit (CPU).

In an embodiment, referring to FIG. 8 again, the package structure further includes a passive electronic device 17 fixed on the first circuit board 15, and a pin of the passive electronic device 17 is electrically connected to the second metal wire 16. The passive electronic device 17 can include a passive resistor or a passive capacitor. The passive electronic device 17 is bound to the first circuit board 15 and is electrically connected to the active chip 6 through the second metal wire 16, the conductor 4, and the first metal wire 8, and thus the passive electronic device 17 and the active chip 6 form a circuit for implementing functions such as filtering and coupling.

Figure 9:
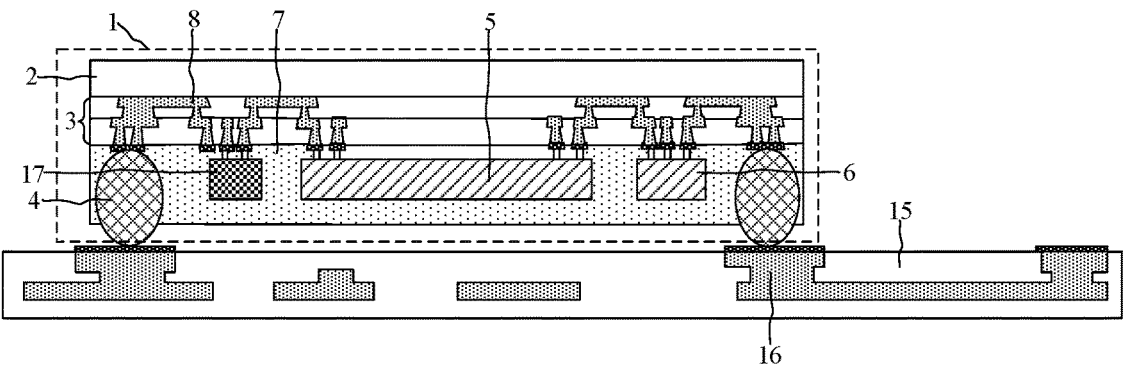
FIG. 9 is a schematic diagram of a package structure provided by another embodiment of the present disclosure.

In another embodiment, as shown in FIG. 9, FIG. 9 is another schematic diagram of the package structure provided by an embodiment of the present disclosure, and the chip package module 1 further includes a passive electronic device 17 located on the side of the wiring layer 3 facing away from the light-transmitting substrate 2 and including a pin electrically connected to the first metal wire 8. In this case, the passive electronic device 17, the photosensitive chip 5, and the source chips 6 are packaged together, which realizes a higher degree of integration of the package structure, and there is no need to occupy spaces of the first circuit board 15.

In addition, it should be noted that, compared with the second metal wire 16 in the first circuit board 15, the accuracy of the first metal wire 8 in the wiring layer 3 is higher, and the wire width and wire spacing are both smaller. Therefore, when the passive electronic device 17 is packaged inside the chip package module 1, to match the wire width and wire spacing of the first metal wire 8, the pin size and pin spacing of the passive electronic device 17 are also smaller, that is, a passive electronic device 17 with a smaller volume can be selected in the package structure, thereby reducing the whole volume of the package structure.

Figure 10:
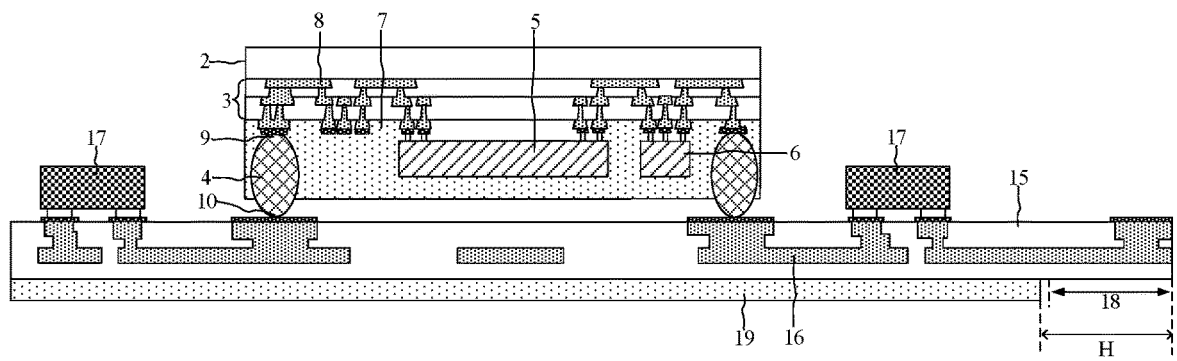
FIG. 10 is a schematic diagram of a package structure provided by another embodiment of the present disclosure.

In an embodiment, as shown in FIG. 10, FIG. 10 is a structural diagram of the package structure provided by another embodiment of the present disclosure, and the first circuit board 15 is a flexible circuit board and has a first connection region 18 close to an edge of the first circuit board 15, and the second metal wire 16 in the first connection region 18 is configured to be directly electrically connected to an external signal processing device.

When the first circuit board 15 is a flexible circuit board, the first circuit board 15 itself can be bent. Therefore, the first circuit board 15 can be directly electrically connected to the external signal processing device, and there is no need to provide a flexible circuit board serving as an intermediate connection board that is located between the first circuit board 15 and the external signal processing device, which simplifies the structural design of the package structure.

In an embodiment, referring to FIG. 10 again, when the first circuit board 15 is a flexible circuit board, the package structure further includes a support board 19 located on a side of the first circuit board 15 facing away from the chip package module 1, and the supporting board 19 is fixed to the first circuit board 15, and can be adhered to the first circuit board 15 by an adhesive layer. The support plate 19 is used to support the first circuit board 15, thereby improving the stability of the chip package module 1 and the electronic device 17 that are located on the first circuit board 15. In addition, the support plate 19 and the first connection region 18 do not overlap in a direction perpendicular to a plane of the first circuit board 15, so as to ensure that a region of the first circuit board 15 that is electrically connected to the external signal processing device can still be bent normally.

It should be noted that when the support plate 19 is provided on a side of the first circuit board 15, a part of the first circuit board 15 protruding from the support plate 19 should not be too short to ensure that this part has a sufficient length for bending and is electrically connected to the external signal processing device. Therefore, in an embodiment of the present disclosure, in the direction perpendicular to the plane of the first circuit board 15, a distance H between an edge of a projection of the support plate 19 that is close to the first connection region 18 and an edge of the first circuit board 15 that is close to the first connection region 18 can be greater than or equal to 5 mm.

Figure 11:
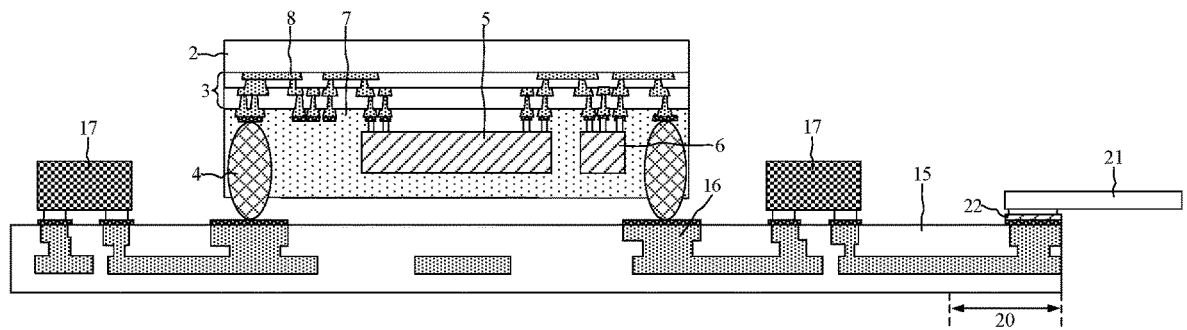
FIG. 11 is a schematic diagram of a package structure provided by another embodiment of the present disclosure.

In another embodiment, as shown in FIG. 11, FIG. 11 is another schematic diagram of the package structure provided by an embodiment of the present disclosure, and the first circuit board 15 is a rigid circuit board and has a second connection region 20 close to the edge of the first circuit board 15. The package structure can further include a second circuit board 21 that is a flexible circuit board, a pin of the second circuit board 21 is electrically connected to the second metal wire 16 in the second connection region 20, and the second circuit board 21 is also configured to be electrically connected to an external signal processing device. The pin of the second circuit board 21 can be electrically connected to the second metal wire 16 in the second connection region 20 by welding. In this case, referring to FIG. 11 again, a pad 22 is provided between the pin of the second circuit board 21 and the second metal wire 16 connected to the pin of the second circuit board 21.

When the first circuit board 15 is a rigid circuit board, the second circuit board 21 can be electrically connected to the external signal processing device through only a flexible intermediate connecting board, that is, the second circuit board 21 is electrically connected to the external signal processing device. When the first circuit board 15 is a rigid circuit board, the first circuit board 15 itself has a relatively large rigidity, and can stably support the supporting the chip package module 1 and the passive electronic device 17 by itself, which improves the structural stability of the package structure.

Figure 12:
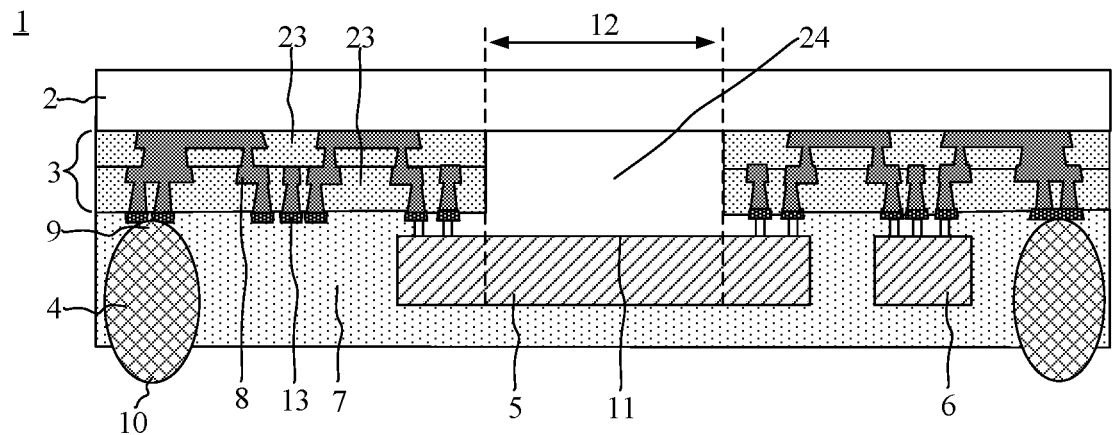
FIG. 12 is a schematic diagram of an interlayer dielectric layer provided by an embodiment of the present disclosure.

In an embodiment, as shown in FIG. 12, FIG. 12 is a schematic diagram of an interlayer dielectric layer provided by an embodiment of the present disclosure, and the wiring layer 3 further includes an interlayer dielectric layer 23 located between adjacent layers of the first metal wire 8 and having a hollow region 24, and the hollow region 24 overlaps the photosensitive region 12 in a direction perpendicular to a plane of the photosensitive chip 5.

By providing the hollow region 24 in the interlayer dielectric layer 23, when the ambient light enters through the light-transmitting substrate 2, at least part of the ambient light directly enters the photosensitive chip 5 after passing through the hollow region 24, without passing through the layer of the interlayer dielectric layer 23, which reduces the loss of light when passing through the interlayer dielectric layer 23 and increases the amount of ambient light collected by the photosensitive chip 5, thereby effectively improving the imaging accuracy.

Figure 13:
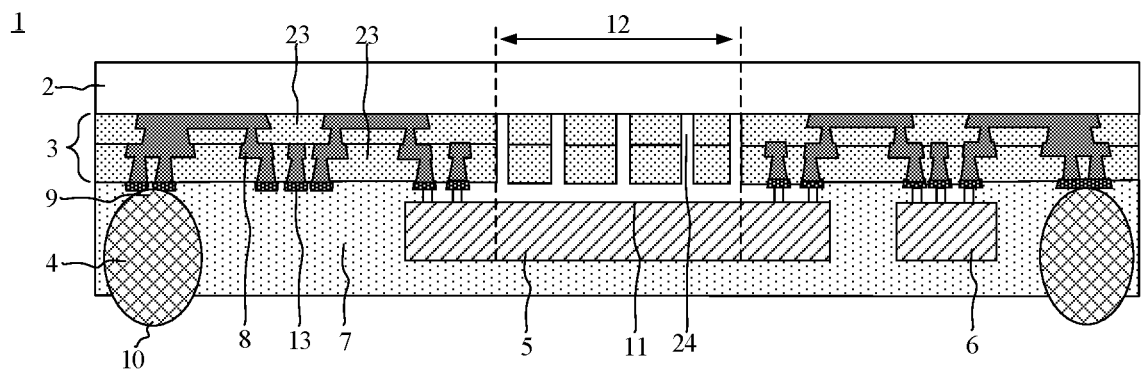
FIG. 13 is a schematic diagram of an interlayer dielectric layer provided by another embodiment of the present disclosure.

In an embodiment, as shown in FIG. 13, FIG. 13 is a schematic diagram of an interlayer dielectric layer provided by an embodiment of the present disclosure, and the interlayer dielectric layer 23 has multiple hollow regions 24 dispersedly arranged. By providing multiple small hollow regions in the interlayer dielectric layer 23, the hollow regions 24 can reduce the loss of ambient light when passing through the interlayer dielectric layer 23, while a part of the layer of the interlayer dielectric layer 23 is still provided on a side of the photosensitive chip 5 facing toward the light-transmitting substrate 2, and when the package structure is impacted or squeezed by an external force, this part of the layer can serve as a buffer to protect the photosensitive chip 5.

In another embodiment, in order to reduce the loss of the ambient light when passing through the interlayer dielectric layer 23 to a greater extent, referring to FIG. 12 again, the hollow region 24 covers and overlaps the photosensitive regions 12 in the direction perpendicular to the plane of the photosensitive chip 5, that is, in this structure, the interlayer dielectric layer 23 has a large hollow region with a larger covering area. With such configuration, since the interlayer dielectric layer 23 above the photosensitive region 12 is completely removed, the light intensity received by each position of the photosensitive region 12 is uniform. In this case, when the package structure is used for imaging or photographing, there is no need to take a difference in brightness at different positions into account, which can reduce the calculation difficulty of imaging color adjustment and image quality adjustment, thereby reducing the price of the driver chip.

Figure 14:
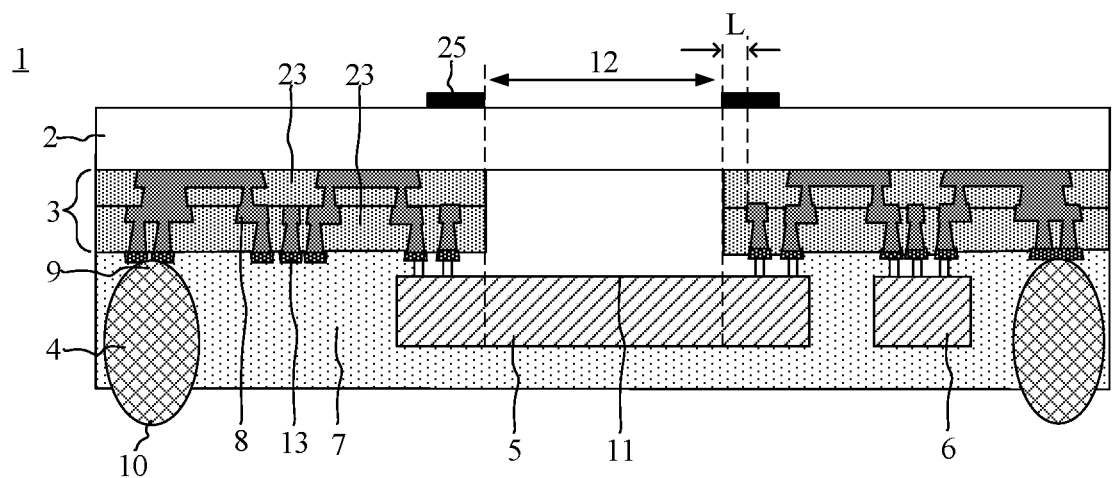
FIG. 14 is a schematic diagram of a light shielding layer provided by an embodiment of the present disclosure.

In an embodiment, as shown in FIG. 14, FIG. 14 is a schematic diagram of a light-shielding layer provided by an embodiment of the present disclosure, and the chip package module 1 further includes a light shielding layer 25 located on a side of the light-transmitting substrate 2 facing away from the photosensitive chip 5 or a side of the light-transmitting substrate 2 facing towards the light-transmitting substrate 2, and a projection of the light shielding layer 25 on the photosensitive chip 5 surrounds the photosensitive region 12 and does not overlap the photosensitive region 12 in the direction perpendicular to the plane of the photosensitive chip 5. With such configuration, stray light can be shielded by the light shielding layer 25, which can avoid that the stray light is transmitted to the photosensitive chip 5 through the light-transmitting substrate 2, thereby improving the imaging accuracy.

Figure 15:
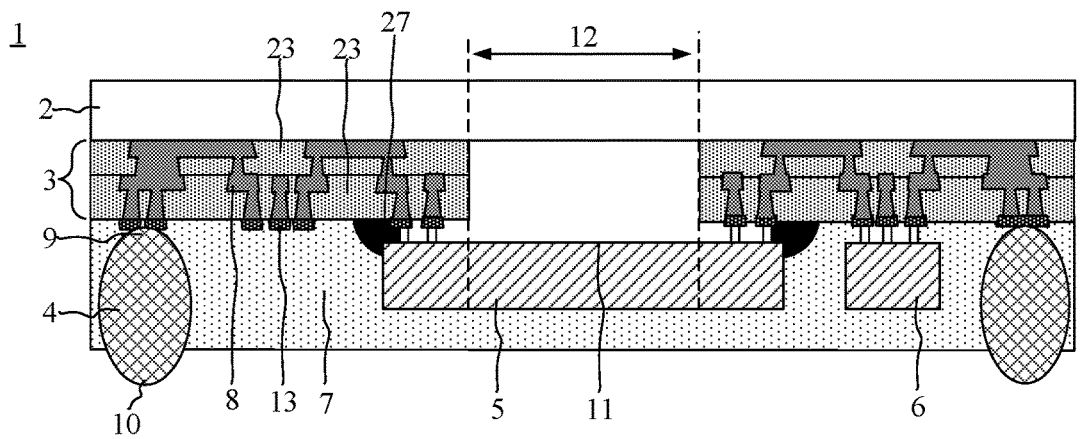
FIG. 15 is a schematic diagram of a filling adhesive provided by an embodiment of the present disclosure.

In an embodiment, as shown in FIG. 15, FIG. 15 is a schematic diagram of a filling adhesive provided by an embodiment of the present disclosure and the chip package module 1 further includes a filling adhesive 27, which is filled on peripheral edges of the photosensitive chip 7 and is in contact with the wiring layer 3. The filling adhesive 27 can make the bonding between the photosensitive chip 5 and the wiring layer 3 more reliable, and also prevent impurities from entering the cavity between the photosensitive chip 5 and the wiring layer 3, and prevent impurities from polluting the photosensitive surface 11 of the photosensitive chip 5.

In an embodiment, the filling adhesive 27 can include a light absorbing material or a light shielding material. In this way, the filling adhesive 27 has a light absorbing or light shielding effect, which can avoid light leakage at the peripheral edges of the connection between the photosensitive chip 5 and the wiring layer 3, and also prevent stray light from entering the photosensitive surface 11.

In an embodiment, referring to FIG. 14 again, in the direction perpendicular to the plane of the photosensitive chip 5, a minimum distance L between a projection of the first metal wire 8 on the plane of the photosensitive chip 5 and the photosensitive region 12 satisfies: L≥0.05 mm. By setting the distance between the first metal wire 8 and the photosensitive region 12 greater than 0.05 mm, even if the position of the first metal wire 8 is shifted due to factors such as alignment accuracy, it can still be avoided that the first metal wire 8 shields the photosensitive region 12, which ensures that more external ambient light enters the photosensitive chip 5.

Figure 16:
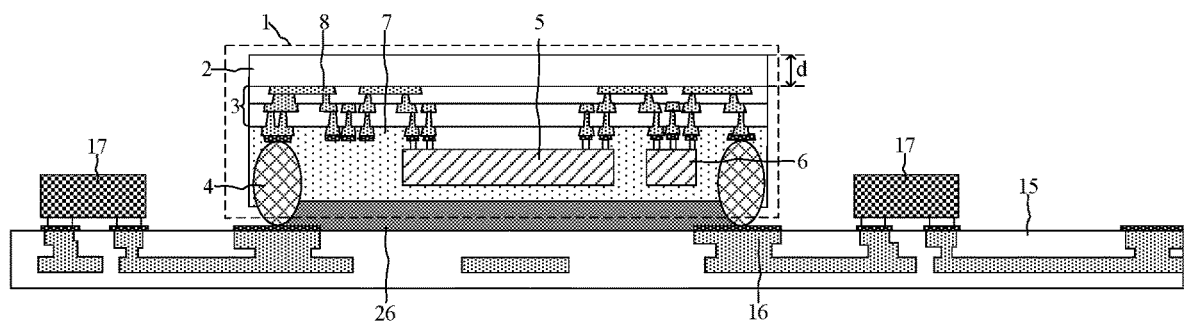
FIG. 16 is a schematic diagram of a support layer provided by an embodiment of the present disclosure.

In an embodiment, as shown in FIG. 16, FIG. 16 is a schematic diagram of a support layer provided by an embodiment of the present disclosure, and an accommodation cavity is provided between a surface of the encapsulation layer 7 facing away from the light-transmitting substrate 2 and a surface of the first circuit board 15 facing towards the light-transmitting substrate 2. A support layer 26 is provided in the accommodation cavity. When the package structure is impacted or squeezed by an external force, the support layer 26 can be used to stably support the chip package module 1 to prevent the chip package module 1 from being damaged or detached from the first circuit board 15.

In an embodiment, referring to FIG. 16 again, the light-transmitting substrate 2 has a thickness of d, and in order to ensure that the whole thickness of the package structure is small, d can satisfy: 0.05 mm≤d≤0.7 mm. In addition, when the light-transmitting substrate 2 is glass, since the film forming process is to be performed on the light-transmitting substrate 2, the light-transmitting substrate must have a certain thickness to maintain good rigidity and be able to withstand the temperature, pH value, and so on of the film forming process. Therefore, the thickness of the light-transmitting substrate 2 can be greater than or equal to 0.5 mm. On the other hand, when the film forming process conditions are met, as the thickness of the light-transmitting substrate 2 increases, the overall thickness will increase, and the light transmittance will also decrease. Therefore, when everything is taken into consideration, the light-transmitting substrate 2 has a thickness not greater than 1 mm, otherwise the overall thickness will not have obvious advantages compared with the chip package structure in the related art. In an embodiment, the thickness of the light-transmitting substrate is smaller than or equal to 0.7 mm.

Figure 17:
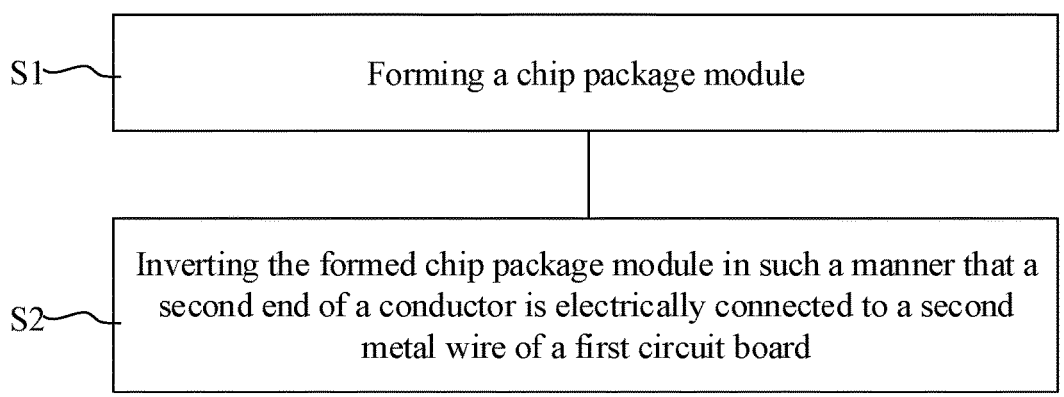
FIG. 17 is a flowchart of a packaging method provided by an embodiment of the present disclosure.

Based on the same inventive concept, an embodiment of the present disclosure also provides a packaging method. With reference to FIG. 2 and FIG. 3, as shown in FIG. 17, FIG. 17 is a flowchart of the packaging method provided by an embodiment of the present disclosure. The packaging method includes steps S1.

At step S1, a chip package module 1 is formed.

Figure 18:
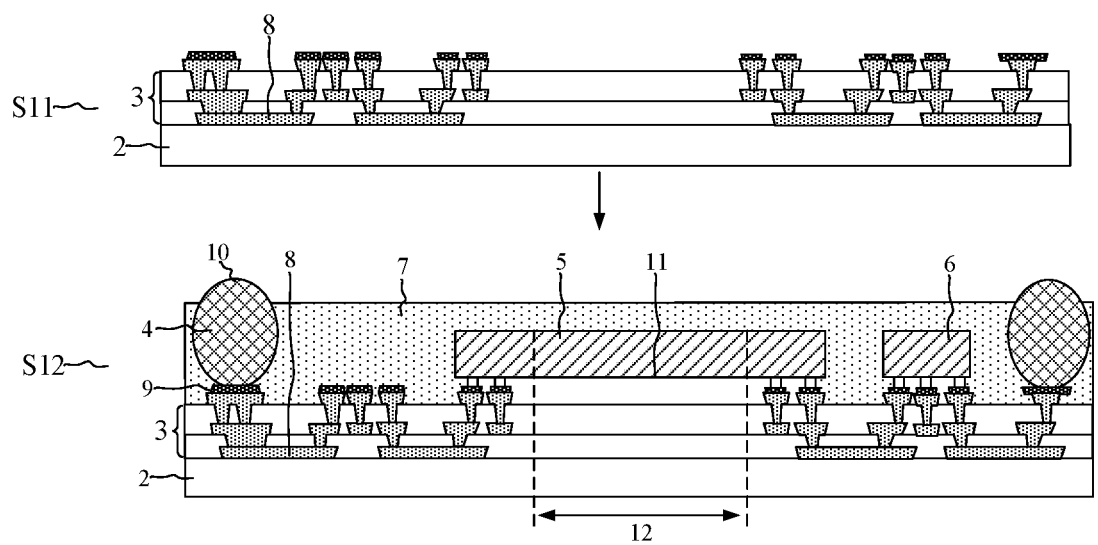
FIG. 18 is a structural flowchart of a method for forming a chip package module provided by an embodiment of the present disclosure.

As shown in FIG. 18, FIG. 18 is a structural flowchart of a method for forming a chip package module provided by an embodiment of the present disclosure. Step S1 can include step S11 and step S12.

At step S11, the wiring layer 3 including the first metal wire 8 is formed on the first side of the light-transmitting substrate 2 with a film forming process. In an embodiment, the film forming process can include a deposition process, an electroplating process, or a printing process. The specific flow of the film forming process has been exemplified in the foregoing embodiment, and will not be repeated herein.

It should be noted that the wiring layer 3 in an embodiment of the present disclosure can be directly formed on the light-transmitting substrate 2 with a film forming process, and the alignment accuracy of the wiring layer 3 and the light-transmitting substrate 2 is higher, so the connection between the first metal wire 8 in the wiring layer 3 and the pin of the photosensitive chip 5 is more reliable.

At step S12, the photosensitive chip 5 and the active chip 6 are bounded to the side of the wiring layer 3 facing away from the light-transmitting substrate 2, and the conductor 4 is formed, and the encapsulation layer 7 is formed. The photosensitive chip 5 includes the photosensitive surface 11 for sensing light signals. The photosensitive surface 11 faces towards the light-transmitting substrate 2 and includes the photosensitive region 12. The first metal wire 8 does not overlap the photosensitive region 12 in the direction perpendicular to the plane of the light-transmitting substrate 2. The first end 9 of the conductor 4 is electrically connected to the first metal wire 8, and the encapsulation layer 7 encapsulates the photosensitive chip 5 and the active chip 6.

In an embodiment of the present disclosure, the photosensitive chip 5 is packaged with a fan-out panel-level packaging process and is bound to the wiring layer 3 located on the light-transmitting substrate 2. On the one hand, the light-transmitting substrate 2 and the wiring layer 3 has a very small thickness, and the total thickness of them is much smaller than the thickness of the base in the related art. Compared with the related art, the package structure provided by the embodiments of the present disclosure is thinner. On the other hand, in the embodiments of the present disclosure, the pin of the photosensitive chip 5 is directly electrically connected to the first metal wire 8 in the wiring layer 3, and then is electrically connected to the circuit board through the conductor 4. With such configuration, there is no need to provide a large number of conductive wires in the package structure, thereby avoiding the problems of large frame width, poor connection accuracy, low yield, and high power consumption of the package structure that are caused by the large number of conductive wires.

In an embodiment of the present disclosure, the active chip 6 and the photosensitive chip 5 are packaged inside the chip package module 1. Compared with the circuit board, the first metal wire 8 in the wiring layer 3 has a higher accuracy, and the wire width and the wire spacing are both small. Therefore, when the active chip 6 is electrically connected to the first metal wire 8, the size and the spacing of the pin of the active chip 6 can also be designed to be smaller, that is, the active chip 6 with a smaller volume can be packaged inside the chip package module 1. Such configuration not only has a higher degree of integration, but also further reduces the overall volume of the package structure. In addition, the active chip 6 and the photosensitive chip 5 are both packaged inside the chip package module 1, and the active chip 6 and the photosensitive chip 5 are electrically connected to each other through only the first metal wire 8 in the wiring layer 3, without the circuit board, thereby realizing a higher reliability of connection therebetween.

Based on the structure of the chip package module 1 described above, when the chip package module 1 is employed in an electronic device, the light-transmitting substrate 2 is located outside the photosensitive chip 5. Based on the above, in an embodiment, with reference to FIG. 5, the process of forming the chip package module 1 further includes: disposing an infrared filter film 14 on the second side of the light-transmitting substrate 2, where the second side is opposite from the first side.

With such configuration, the light-transmitting substrate 2 with the infrared filter film 14 serves not only as the carrier substrate for the wiring layer 3, but also is reused as an infrared filter structure, and therefore there is no need to provide an additional filter structure in the package structure, which not only reduces an overall thickness of the package structure, but also saves the manufacturing cost. The infrared filter film 14 and the wiring layer 3 are respectively located on opposite sides of the light-transmitting substrate 2, and the infrared filter film 14 will not affect the film forming process of the wiring layer 3, therefore reducing the risk that the wiring layer 3 is detached from the light-transmitting substrate 2.

In an embodiment, the process of providing the infrared filter film 14 can include forming the infrared filter film 14 on the second side of the light-transmitting substrate 2 with a film forming process, or attaching the infrared filter film 14 to the second side of the light-transmitting substrate 2. With the two configurations, a high adhesion between the infrared filter film 14 and the light-transmitting substrate 2 is achieved, and the infrared filter film 14 is not easily detached.

In an embodiment, referring to FIG. 8 and referring to FIG. 17 again, the packaging method further includes step S2.

At step S2, the formed chip package module 1 is inverted, so that the second end 10 of the conductor 4 is electrically connected to the second metal wire 16 of the first circuit board 15.

With such configuration, the signals output by the photosensitive chip 5 and the active chip 6 are transmitted to the conductor 4 through the first metal wire 8, and then is transmitted to the first circuit board 15 through the conductor 4, thereby realizing signal transmission with the signal with the external signal device.

In an embodiment, with reference to FIG. 8, the packaging method further includes binding the passive electronic device 17 to the first circuit board 15. The passive electronic device 17 can include a passive resistor or a passive capacitor. The passive electronic device 17 is bound to the first circuit board 15 and is electrically connected to the active chip 6 through the second metal wire 16, the conductor 4, and the first metal wire 8, and together with the active chip 6, form a circuit for implementing functions such as filtering and coupling.

In an embodiment, referring to FIG. 15, after the photosensitive chip 5 is bound to the side of the wiring layer 3 facing away from the light-transmitting substrate 2, the packaging method further includes filling the filling adhesive 27 on the peripheral edges of the photosensitive chip 5. The filling adhesive 27 is filled on the peripheral edges of the photosensitive chip 5 and is in contact with the wiring layer 3. The filling adhesive 27 makes the bonding between the photosensitive chip 5 and the wiring layer 3 more reliable, and also prevents impurities from entering the cavity between the photosensitive chip 5 and the wiring layer 3, and prevents impurities from polluting the photosensitive surface 11 of the photosensitive chip 5.

In an embodiment, the filling adhesive 27 can include light absorbing materials or light shielding materials. In this case, the filling adhesive 27 can avoid light leakage at the peripheral edge of the connection between the photosensitive chip 5 and the wiring layer 3, and can also prevent stray light from entering the photosensitive surface 11.

Figure 19:
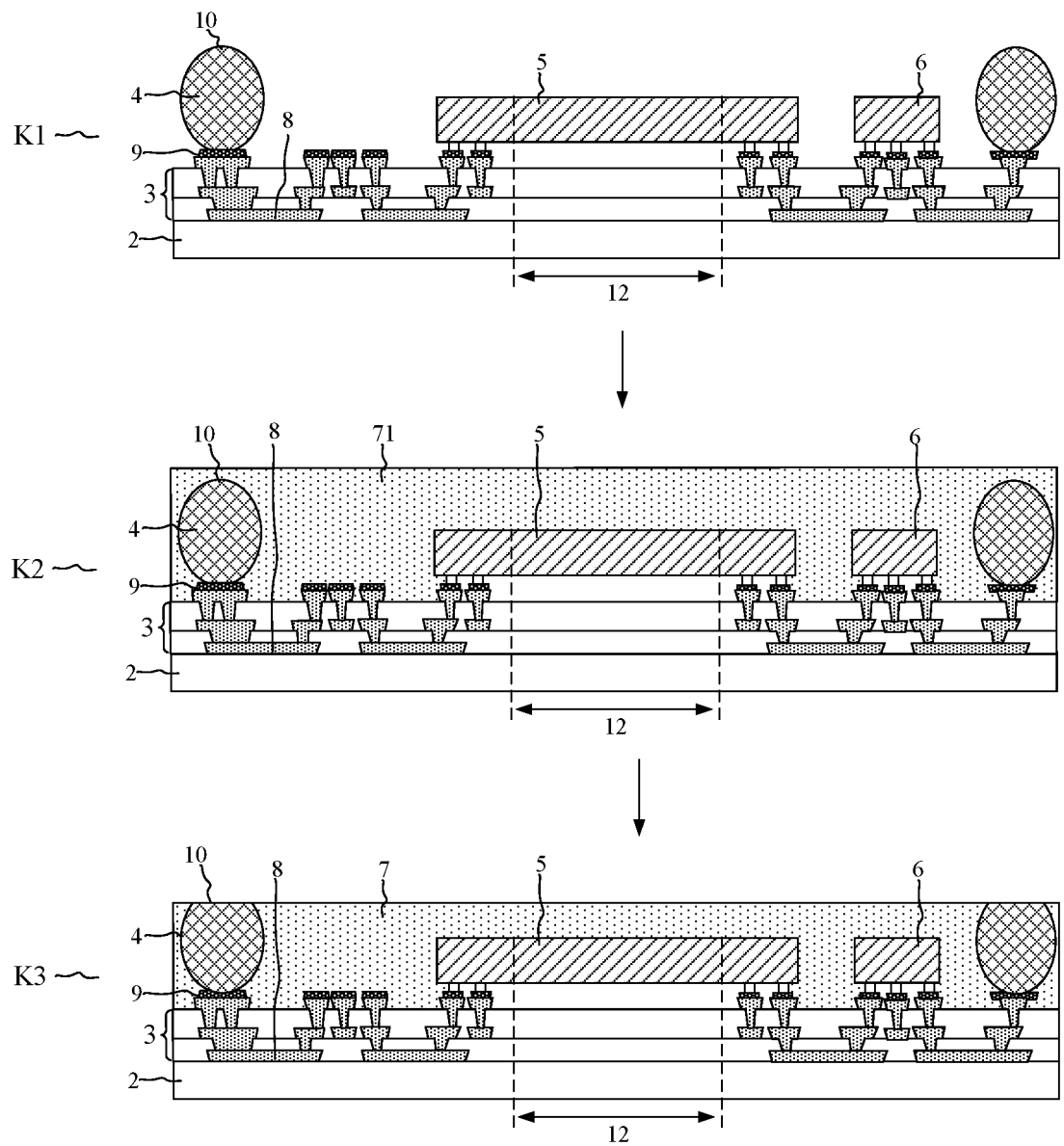
FIG. 19 is a process flowchart of a conductor and a encapsulation layer provided by an embodiment of the present disclosure.

In an embodiment, as shown in FIG. 19, FIG. 19 is a process flow diagram of the conductor and the encapsulation layer provided by the embodiment of the present disclosure. Step S1 can include:

Step K1: binding the photosensitive chip 5 and the active chip 6 to the side of the wiring layer 3 facing away from the light-transmitting substrate 2 and forming a conductor 4, where the photosensitive chip 5 and the active chip 6 can be bound first, and then the conductor 4 is formed; or the conductor 4 is formed first, and then the photosensitive chip 5 and the active chip 6 are bound;

Step K2: forming a plastic encapsulation pre-layer 71 on the side of the wiring layer 3 facing away from the light-transmitting substrate, where the plastic encapsulation pre-layer 71 has a height greater than a height of the conductor 4 in the direction perpendicular to the plane of the light-transmitting substrate 2, and the plastic encapsulation pre-layer 71 encapsulates the conductor 4, the photosensitive chip 5 and the active chip 6; and Step K3: polishing the plastic encapsulation pre-layer 71 so that the second end 10 of the conductor 4 is exposed out of the polished surface of the molding layer 7.

It should be noted that, referring to FIG. 19 again, when the second end 10 of the conductive body 4 is exposed out of the surface of the encapsulation layer 7 through the polishing process, the conductor 4 is aligned with a surface of the encapsulation layer 7 facing away from the light-transmitting substrate 2. In this process, the polished conductor 4 and the encapsulation layer 7 has a same height, and the end of the conductor 4 does not need to protrude from the encapsulation layer 7. Therefore, the overall thickness of the chip package module 1 is small, which reduces the volume of the package structure. With the process, the conductor 4 is first formed, and then the encapsulation layer 7 is formed, which can ensure that the encapsulation layer 7 tightly encapsulates the conductor 4 and can ensure that there is no gap between the encapsulation layer 7 and the conductor 4, which enhances the protection of the encapsulation layer 7 to the conductor 4.

Figure 20:
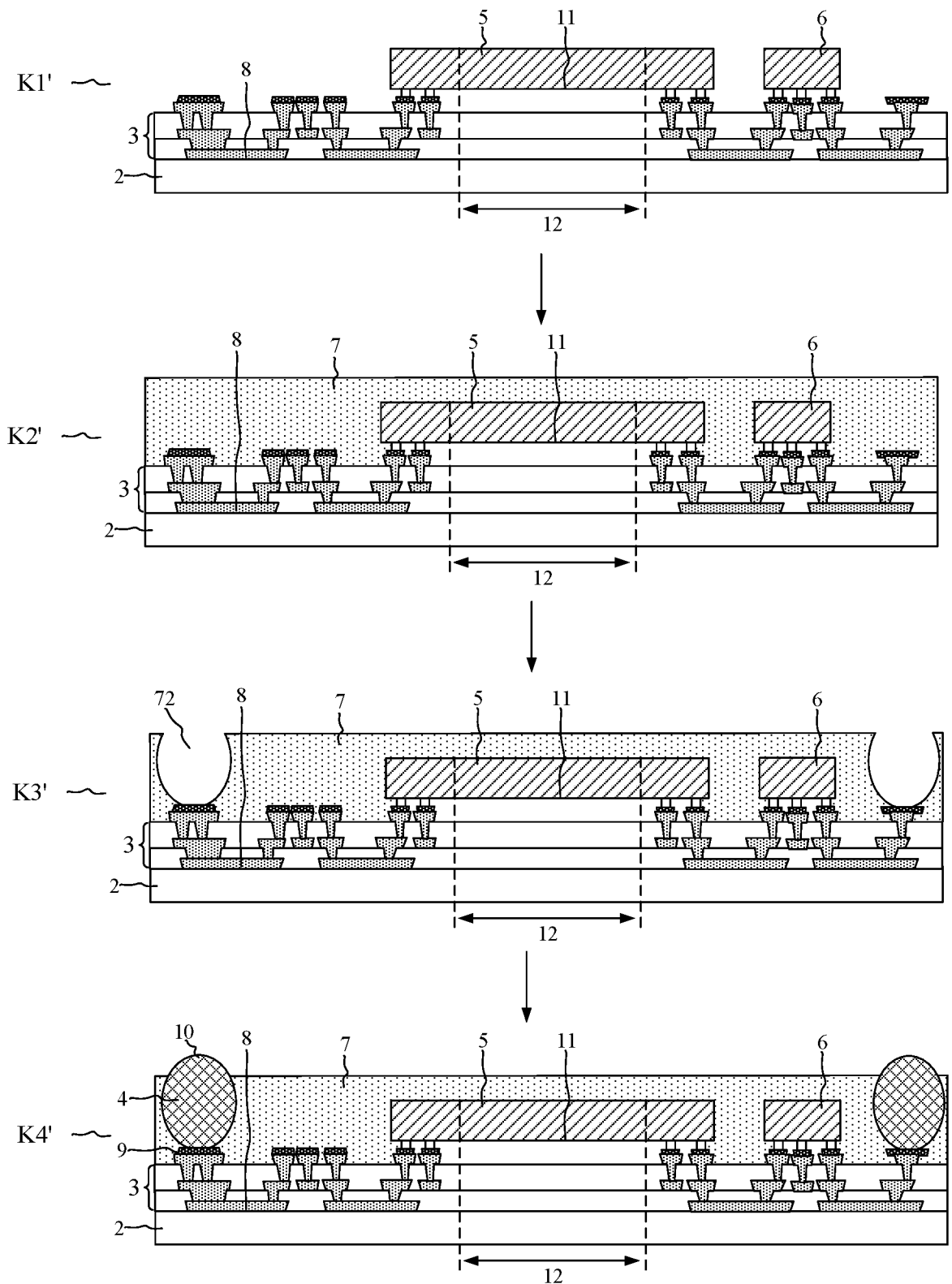
FIG. 20 is another process flowchart of the conductor and the encapsulation layer provided by an embodiment of the present disclosure.

In another embodiment, as shown in FIG. 20, FIG. 20 is another process flowchart of the conductive body and the encapsulation layer provided by the embodiment of the present disclosure, and step S1 can include:

Step K1': binding the photosensitive chip 5 and the active chip 6 on the side of the wiring layer 3 facing away from the light-transmitting substrate 2;

Step K2': forming the encapsulation layer 7 on the side of the wiring layer 3 facing away from the light-transmitting substrate 2, the encapsulation layer 7 encapsulating the photosensitive chip 5 and the active chip 6;

Step K3': forming a via 72 on the encapsulation layer 7, the via 72 exposing the first metal wire 8;

Step K4': forming the conductive body 4 in the via 72, the second end 10 of the conductive body 4 being exposed outside the encapsulation layer 7.

Referring to FIG. 20 again, when the conductor 4 and the encapsulation layer 7 are formed with the above process, the encapsulation layer 7 has a height smaller than a height of the conductor 4 in the direction perpendicular to the plane of the light-transmitting substrate 2, so as to ensure that the second end 10 of the conductor 4 can protrude from the encapsulation layer 7 and be exposed to the outside, which ensures that the end of the conductor 4 is not covered by the encapsulation layer 7 to a greater extent. In the subsequent process, when the chip package module 1 is electrically connected to the first circuit board 15, the reliability of the electrical connection between the second end 10 of the conductor 4 and the second metal wire 16 can be improved.

Figure 21:
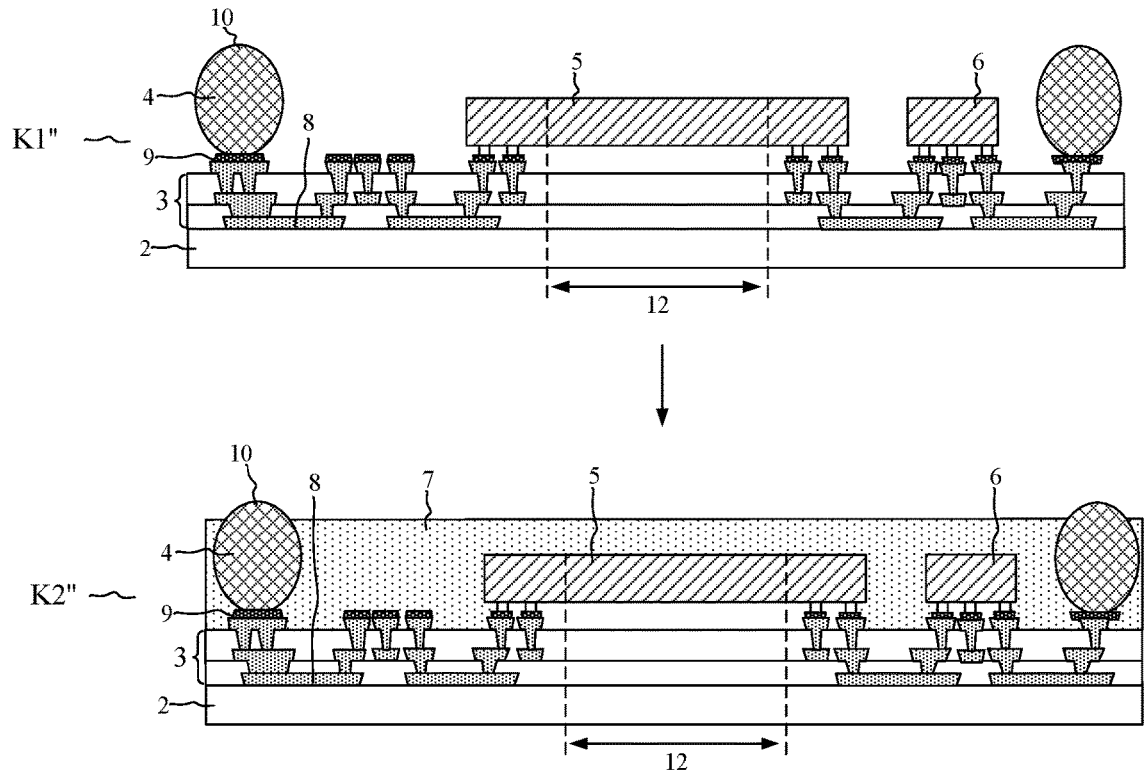
FIG. 21 is another process flowchart of the conductor and the encapsulation layer provided by an embodiment of the present disclosure.

In another embodiment, as shown in FIG. 21, FIG. 21 is another process flowchart of the conductive body and the encapsulation layer provided by the embodiment of the present disclosure, and step S1 can include:

Step K1": binding the photosensitive chip 5 and the active chip 6 on the side of the wiring layer 3 facing away from the light-transmitting substrate 2, and forming the conductor 4, where the photosensitive chip 5 and the active chip 6 can be bound first, and then the conductor 4 is formed; or the conductor 4 can be formed first, and then the photosensitive chip 5 and the active chip 6 are bound; and Step K2": forming a encapsulation layer 7 on the side of the wiring layer 3 facing away from the light-transmitting substrate 2, where the encapsulation layer 7 has a height smaller than the height of the conductor 4 in the direction perpendicular to the plane of the light-transmitting substrate 2; the encapsulation layer 7 encapsulates the photosensitive chip 5, the active chip 6 and a part of the conductive body 4; and the second end 10 of the conductive body 4 is exposed outside of the encapsulation layer 7.

In the above process, a thinner encapsulation layer 7 can be formed after the conductor 4 is formed, and the second end 10 of the conductor 4 is exposed, and there is no need to polish or form a via on the encapsulation layer 7, which make the process simpler. The second end 10 of the conductor 4 of this structure is exposed to the outside. In the subsequent process, when the chip package module 1 is electrically connected to the first circuit board 15, the second end 10 of the conductor 4 and the second metal wire 16 can be electrically connected more reliably.

Figure 22:
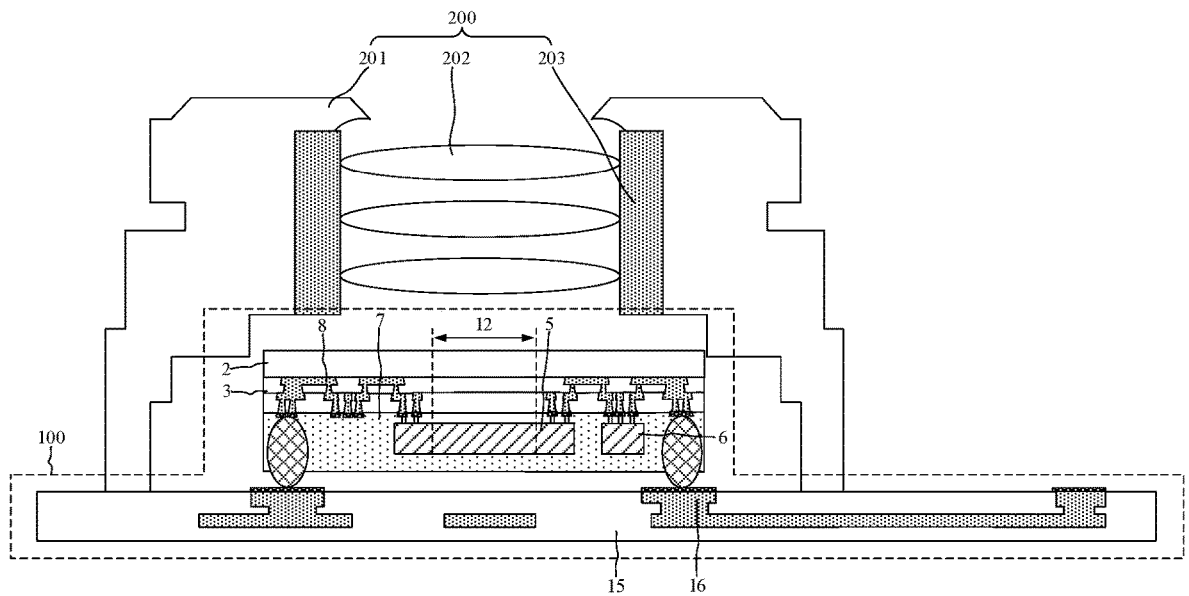
FIG. 22 is a schematic diagram of a camera module provided by an embodiment of the present disclosure.

Based on the same inventive concept, an embodiment of the present disclosure also provides a camera module, as shown in FIG. 22. FIG. 22 is a schematic diagram of a camera module provided by an embodiment of the present disclosure. The camera module includes the above-mentioned package structure 100 and a lens assembly 200. The specific structure of the package structure 100 has been described in detail in the above-mentioned embodiment, and will not be repeated herein. The lens assembly 200 includes a housing 201 and at least one lens 202 located in the housing 201. The lens 202 is located on the side of the light-transmitting substrate 2 facing away from the photosensitive chip 5 in the package structure. The lens 202 overlaps the photosensitive region 12 of the photosensitive chip 5 in the direction perpendicular to the plane of the light-transmitting substrate 2.

Since the camera module provided by the embodiment of the present disclosure includes the above-mentioned package structure 100, the camera module has a small thickness and a small frame and thus is lighter and thinner.

In an embodiment, referring to FIG. 22 again, the lens assembly 200 further includes a focus motor 203 located in the housing 201, and the focus motor 203 is configured to accurately adjust a position of the lens 202 during the shooting process to ensure the focus effect.

Figure 23:
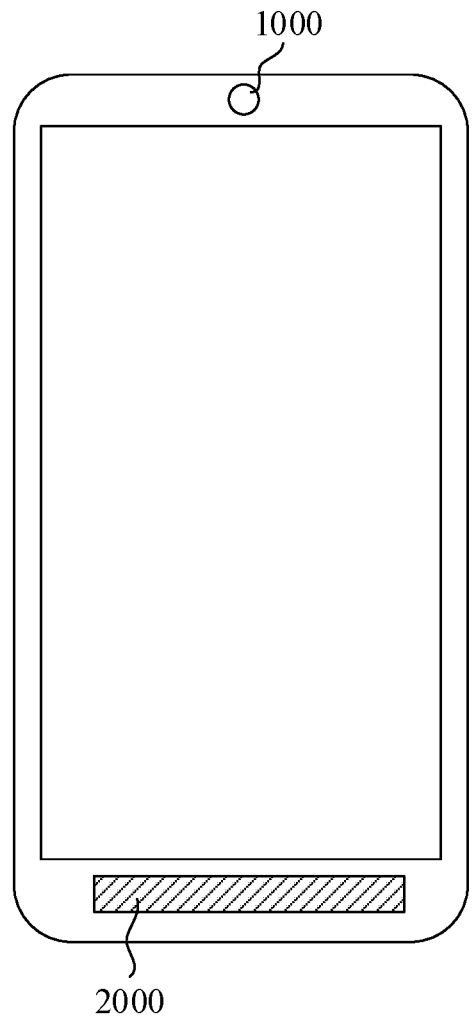
FIG. 23 is a schematic diagram of an electronic device provided by an embodiment of the present disclosure.

Based on the same inventive concept, an embodiment of the present disclosure also provides an electronic device. As shown in FIG. 23, FIG. 23 is a schematic diagram of the electronic device provided by the embodiment of the present disclosure. The electronic device includes a camera module 1000 and a driver chip 2000, the driver chip 2000 is configured to generate an image according to the electrical signal converted by the photosensitive chip 5 in the camera module. The electronic device shown in FIG. 23 is only for schematic illustration, and the display device can be other electronic device with a display function, such as a mobile phone, a notebook computer, or a video camera.

The above are only some embodiments of the present disclosure and are not intended to limit the present disclosure. Any modifications, equivalents, improvements, etc., which are made within the principles of the present disclosure, should be included in the scope of the present disclosure.

Finally, it should be noted that the above embodiments are only used to illustrate the technical solutions of the present disclosure, not to limit them; although the present disclosure has been described in detail with reference to the foregoing embodiments, those skilled in the art should understand that: The technical solutions recorded in the foregoing embodiments are modified, or some or all of the technical features are equivalently replaced; these modifications or replacements do not cause the essence of the corresponding technical solutions to deviate from the scope of the technical solutions of the embodiments of the present disclosure.

What is claimed is:

1. A package structure, comprising a chip package module, wherein the chip package module comprises:
    light-transmitting substrate;
    a wiring layer located on a side of the light-transmitting substrate and comprising a first metal wire, wherein the wiring layer is directly formed on the side of the light-transmitting substrate in a form of film;
    a conductor located on a side of the wiring layer facing away from the light-transmitting substrate, wherein the conductor comprises a first end electrically connected to the first metal wire, and a second end;
    a photosensitive chip located on the side of the wiring layer facing away from the light-transmitting substrate, wherein the photosensitive chip comprises a pin electrically connected to the first metal wire and having a photosensitive surface configured to sense a photometric signal, and the photosensitive surface faces towards the light-transmitting substrate and comprises a photosensitive region that is not overlapping the first metal wire in a direction perpendicular to a principal plane of the light-transmitting substrate;
    an active chip located on the side of the wiring layer facing away from the light-transmitting substrate and comprising a pin electrically connected to the first metal wire; and
    an encapsulation layer that encapsulates the photosensitive chip and the active chip.

2. The package structure of claim 1, wherein the chip package module further comprises an infrared filter film located on a side of the light-transmitting substrate, and the infrared filter film overlaps the photosensitive region in the direction perpendicular to the principal plane of the light-transmitting substrate.

3. The package structure of claim 2, wherein the infrared filter film is located on a side of the light-transmitting substrate facing away from the photosensitive chip.

4. The package structure of claim 1, further comprising:
a first circuit board bound to the chip package module and located on a side of the encapsulation layer facing away from the light-transmitting substrate, wherein the first circuit board comprises at least one second metal wire electrically connected to the second end of the conductor.

5. The package structure of claim 4, further comprising:
a passive electronic device fixed on the first circuit board and comprising a pin electrically connected to the at least one second metal wire.

6. The package structure of claim 4, wherein the first circuit board is a flexible circuit board and has a first connection region close to an edge of the first circuit board, and one of the at least one second metal wire that is located in the first connection region is configured to be directly electrically connected to an external signal processing device.

7. The package structure of claim 6, further comprising:
a support plate located on a side of the first circuit board facing away from the chip package module, wherein the support plate does not overlap the first connection region in a direction perpendicular to a principal plane of the first circuit board.

8. The package structure of claim 4, wherein the first circuit board is a rigid circuit board having a second connection region close to an edge of the first circuit board, and the package structure further comprises a second circuit board, and the second circuit board is a flexible circuit board and comprises a pin electrically connected one of the at least one second metal wire located in the second connection region, and the second circuit board is configured to be electrically connected to an external signal processing device.

9. The package structure of claim 4, wherein an accommodating cavity is provided between a surface of the encapsulation layer facing away from the light-transmitting substrate and a surface of the first circuit board facing towards the light-transmitting substrate, and a support layer is provided in the accommodating cavity.

10. The package structure of claim 1, wherein the chip package module further comprises a passive electronic device located on the side of the wiring layer facing away from the light-transmitting substrate, wherein the passive electronic device comprises a pin electrically connected to the first metal wire.

11. The package structure of claim 1, wherein the wiring layer further comprises an interlayer dielectric layer having a hollow region, and the hollow region overlaps the photosensitive region in a direction perpendicular to a principal plane of the photosensitive chip.

12. The package structure of claim 11, wherein the hollow region covers the photosensitive region in the direction perpendicular to the principal plane of the photosensitive chip.

13. The package structure of claim 1, wherein the chip package module further comprises a light shielding layer located on a side of the light-transmitting substrate facing towards the photosensitive chip or located on a side of the light-transmitting substrate facing away from the photosensitive chip, wherein a projection of the light shielding layer on a plane of the photosensitive chip surrounds the photosensitive region and does not overlap the photosensitive region in a direction perpendicular to the principal plane of the photosensitive chip.

14. The package structure of claim 1, wherein a minimum distance between a projection of the first metal wire on a plane of the photosensitive chip and the photosensitive region is L, where L≥0.05 mm.

15. The package structure of claim 1, wherein the package structure comprises an anti-oxidation layer located on the side of the wiring layer facing away from the light-transmitting substrate, and wherein the anti-oxidation layer covers the first metal wire of the wiring layer, and wherein the first metal wire is at least partially exposed outside of the wiring layer.

16. The package structure of claim 1, wherein the chip package module further comprises a filling adhesive filled on peripheral edges of the photosensitive chip and in contact with the wiring layer.

17. The package structure of claim 16, wherein the filling adhesive comprises a light absorbing material or a light shielding material.

18. The package structure of claim 1, wherein the light-transmitting substrate has a thickness of d, where 0.05 mm≤d≤0.7 mm.

19. A camera module, comprising:
a package structure having a chip package module, wherein the chip package module comprises:
light-transmitting substrate;
a wiring layer located on a side of the light-transmitting substrate and comprising a first metal wire, wherein the wiring layer is directly formed on the side of the light-transmitting substrate in a form of film;
a conductor located on a side of the wiring layer facing away from the light-transmitting substrate, wherein the conductor comprises a first end electrically connected to the first metal wire, and a second end;
a photosensitive chip located on the side of the wiring layer facing away from the light-transmitting substrate, wherein the photosensitive chip comprises a pin electrically connected to the first metal wire and having a photosensitive surface configured to sense a photometric signal, and the photosensitive surface faces towards the light-transmitting substrate and comprises a photosensitive region that is not overlapping the first metal wire in a direction perpendicular to a principal plane of the light-transmitting substrate;
an active chip located on the side of the wiring layer facing away from the light-transmitting substrate and comprising a pin electrically connected to the first metal wire; and
an encapsulation layer that encapsulates the photosensitive chip and the active chip; and
a lens assembly comprising a housing and at least one lens located in the housing, wherein the at least one lens is located on a side of the light-transmitting substrate facing away from the photosensitive chip in the package structure, and the at least one lens overlaps the photosensitive region of the photosensitive chip in the direction perpendicular to a principal plane of the light-transmitting substrate.

20. The camera module of claim 19, wherein the lens assembly further comprises a focus motor located in the housing.

* * * * *